(12) United States Patent
Sridhara et al.

(10) Patent No.: US 9,496,024 B1
(45) Date of Patent: Nov. 15, 2016

(54) AUTOMATIC LATCH-UP PREVENTION IN SRAM

(71) Applicant: TEXAS INSTRUMENTS INCORPORATED, Dallas, TX (US)

(72) Inventors: Srinivasa Raghavan Sridhara, Plano, TX (US); Sanjeev Kumar Suman, Bangalore (IN); Premkumar Seetharaman, Bangalore (IN); Keshav Bhaktavatson Chintamani, Bangalore (IN); Atul Ramakant Lele, Bangalore (IN); Raviprakash S. Rao, Dallas, TX (US); Parvinder Kumar Rana, Bangalore (IN); Ajith Subramonia, Bangalore (IN); Vipul K. Singhal, Bangalore (IN); Malav Shrikant Shah, Bangalore (IN); Bharath Kumar Poluri, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/974,945

(22) Filed: Dec. 18, 2015

(51) Int. Cl.
*G11C 5/14* (2006.01)
*G11C 11/417* (2006.01)

(52) U.S. Cl.
CPC .................................. *G11C 11/417* (2013.01)

(58) Field of Classification Search
USPC ................... 365/226, 227, 229, 154
See application file for complete search history.

(56) References Cited

U.S. PATENT DOCUMENTS

| | | | | |
|---|---|---|---|---|
| 5,942,932 A | * | 8/1999 | Shen | H01L 27/0921 257/E27.063 |
| 6,188,628 B1 | * | 2/2001 | Tomotani | G11C 5/14 365/226 |
| 7,092,307 B2 | * | 8/2006 | Chen | G11C 11/4074 365/226 |
| 2003/0076705 A1 | * | 4/2003 | Yamaoka | G11C 5/146 365/154 |

* cited by examiner

*Primary Examiner* — Vu Le
(74) *Attorney, Agent, or Firm* — John R. Pessetto; Charles A. Brill; Frank D. Cimino

(57) ABSTRACT

A system on a chip (SOC) includes a processor and a memory system coupled to the processor. The memory system includes a static random access memory (SRAM) bank and a memory controller. The SRAM bank includes a first switch coupled to a SRAM array power supply and a source of a transistor of an SRAM storage cell in an SRAM array. The SRAM bank also includes a second switch coupled to a NWELL power supply and a bulk of the transistor of the SRAM storage cell. The second switch is configured to close prior to the first switch closing during power up of the SRAM array.

20 Claims, 3 Drawing Sheets

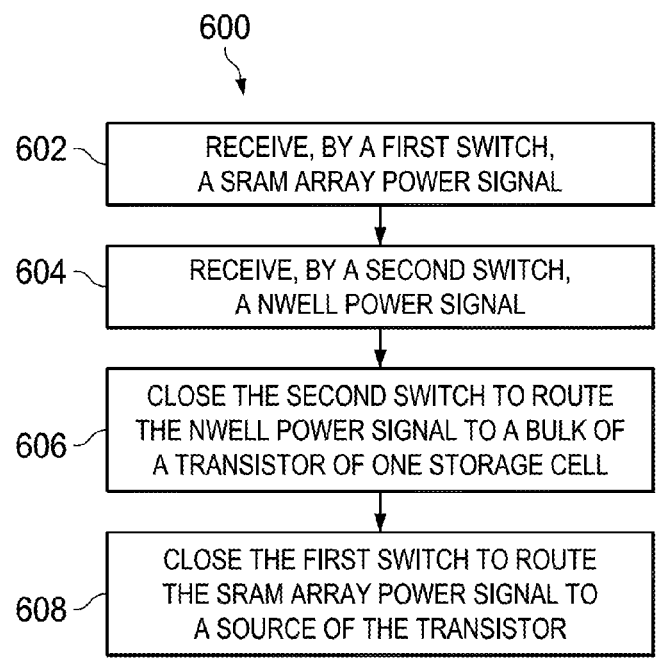
FIG. 6
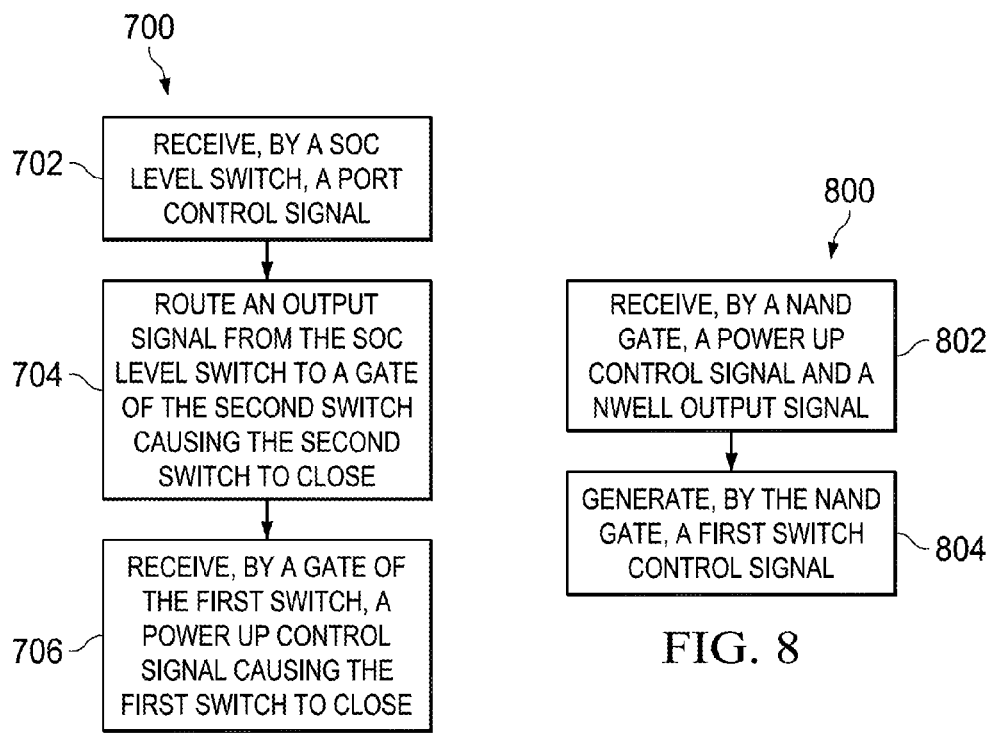
FIG. 7
FIG. 8

AUTOMATIC LATCH-UP PREVENTION IN SRAM

BACKGROUND

Static random access memory (SRAM) is memory that utilizes latching to store each bit. Because SRAM is static, there is no need to periodically refresh the memory, and is, therefore, typically faster, less dense, and more expensive, than dynamic random-access memory (DRAM). Due to SRAM's speed, SRAM is typically used in computer applications that require a fast memory such as cache memory for the central processing unit (CPU), external burst mode SRAM caches, hard disk buffers, router buffers, CPU register files, etc. SRAM typically includes an SRAM array of storage cells arranged in rows and columns. At the intersection of each word line corresponding to the rows and bit lines corresponding to the columns resides a storage cell that stores data. Each storage cell may be formed with a pair of cross-coupled inverters. Each inverter includes a p-channel (PMOS) transistor and an n-channel (NMOS) transistor. Gate enhanced drain leakage (GEDL) in the SRAM array may account for a large percentage (e.g., 60%) of total SRAM leakage. SRAM array leakage, mainly due to the GEDL component, may contribute a significant portion of total system on a chip (SOC) leakage.

SUMMARY

The problems noted above are solved in large part by systems and methods for preventing latch-up in a system on a chip (SOC). In some embodiments, a SOC includes a processor and a memory system coupled to the processor. The memory system includes a static random access memory (SRAM) bank and a memory controller. The SRAM bank includes a first switch coupled to a SRAM array power supply and a source of a transistor of an SRAM storage cell in an SRAM array. The SRAM bank also includes a second switch coupled to a NWELL power supply and a bulk of the transistor of the SRAM storage cell. The second switch is configured to close prior to the first switch closing during power up of the SRAM array.

Another illustrative embodiment is a method for preventing latch-up in a SOC. The method may comprise receiving, by a first switch, a SRAM array power signal. The SRAM array power signal is configured to power a plurality of storage cells of an SRAM array. The method also comprises receiving, by a second switch, a NWELL power signal configured to power a plurality of NWELLs of the SRAM array. The method also comprises closing the second switch to route the NWELL power signal to a bulk of a transistor of one of the storage cells. The method also may comprise closing, after the closing of the second switch, the first switch to route the SRAM array power signal to a source of the transistor.

Yet another illustrative embodiment is a SRAM bank that includes a SRAM array, a first switch, and a second switch. The SRAM array includes a plurality of storage cells and a plurality of edge cells surrounding the plurality of storage cells. The first switch is coupled to a SRAM array power supply and a source of a given transistor in each of the plurality of storage cells. The second switch is coupled to a NWELL power supply and a bulk of the given transistor in each of the plurality of storage cells. The second switch is configured to close prior to the first switch closing during power up of the SRAM array.

BRIEF DESCRIPTION OF THE DRAWINGS

For a detailed description of various examples, reference will now be made to the accompanying drawings in which:

FIG. 6 shows a flow diagram of a method for preventing latch-up in a SOC in accordance with various embodiments;

FIG. 7 shows a flow diagram of a method for closing two switches in accordance with various embodiments; and FIG. 8 shows a flow diagram of a method for closing two switches in accordance with various embodiments.

NOTATION AND NOMENCLATURE

Figure 1:
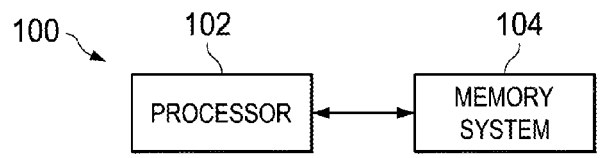
FIG. 1 shows a block diagram of a system on a chip (SOC) in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Static random access memory (SRAM) is memory that utilizes latching to store each bit. Because SRAM is static, there is no need to periodically refresh the memory, and is, therefore, typically faster, less dense, and more expensive, than dynamic random-access memory (DRAM). Due to SRAM's speed, SRAM is typically used in computer applications that require a fast memory such as cache memory for the central processing unit (CPU), external burst mode SRAM caches, hard disk buffers, router buffers, CPU register files, etc. Therefore, SRAM is a fundamental building block of many systems. While SRAM is fast, it also consumes a significant portion of system's level dynamic power. SRAM typically includes an SRAM array of storage cells arranged in rows and columns. At the intersection of each word line corresponding to the rows and bit lines corresponding to the columns resides a storage cell that stores data. Each storage cell may be formed with a pair of cross-coupled inverters. Each inverter includes a p-channel (PMOS) transistor and an n-channel (NMOS) transistor. Gate enhanced drain leakage (GEDL) in the SRAM array may account for a large percentage (e.g., 60%) of total SRAM leakage. SRAM array leakage, mainly due to the GEDL component, may contribute a significant portion of total system on a chip (SOC) leakage.

In many applications, body bias of PMOS load transistors inside an SRAM array is modified to eliminate GEDL leakage. Additionally, body bias control of the load transistor is effective in emulating negative bias temperature instability (NBTI) at the beginning of life of the SRAM and also in testing SRAMs for stability. Therefore, two separate voltage rails may be used to supply power to the SRAM array: VDDAR (SRAM array power supply) and VNWA (NWELL power supply of the array). Thus, VDDAR may connect to the source of the PMOS transistors that make up the storage cells of the SRAM array while VNWA connects to the body (i.e., bulk) of the same PMOS transistors. In many applications, GEDL may be high. One way to reduce GEDL in an SRAM array is to add a switch on VNWA outside of the SRAM array. Additionally, outside of the SRAM array, VDDAR and VNWA may connect to their own power grid with different SOC dependent routing topologies and voltage multiplexors. In some cases, VDDAR may arrive at the SRAM array directly from a voltage regulator (e.g., a low-dropout (LDO) regulator, a DC-DC Buck converter, etc.) while VNWA may arrive at the SRAM array via the switch that prevents GEDL, a voltage multiplexor (for multiplexing the test voltage), and a long power net. Thus, during power-up, it is possible for the VDDAR to ramp up (i.e., increases) from zero to a predetermined voltage faster than VNWA ramps up from zero to the same or another predetermined voltage because, in this situation, VDDAR encounters a significantly smaller resistor-capacitor (RC) delay. If the VDDAR ramps up prior to VNWA, then the parasitic PNP bipolar junction transistor (BJT) inside the storage cells of the SRAM array could turn ON. In some situations, a latch-up may occur and cause malfunction or destruction of the die in which the SRAM is fabricated. Thus, timing control on the VNWA switch outside of the SRAM array is important. Improper control of this switch may lead to latch-up in the SRAM array.

In accordance with the disclosed principles, a system on a chip (SOC) may include a memory system that includes a memory controller, a SRAM bank, and an SRAM array. The SRAM bank may include two switches, one switch connected to VDDAR and one switch connected to VNWA. The switch connected to VDDAR is also connected to a source of the PMOS transistors that make up the storage cells of the SRAM array while VNWA connects to the body of the same PMOS transistors. Thus, VDDAR is the SRAM array power supply while VNWA is the NWELL power supply. The switch connected to VNWA reduces GEDL within the SRAM array. To avoid latch-up, the memory system is configured such that the switch connected to VNWA closes prior to the switch connected to VDDAR. Thus, upon power-up, VNWA ramps up and provides power to the NWELL within the SRAM array prior to VDDAR providing power to the other parts of the SRAM array. In this way, GEDL within the SRAM array is reduced, and latch-ups are prevented.

FIG. 1 shows a block diagram of SOC 100 in accordance with various embodiments. SOC 100 is an integrated circuit that may include processor 102 and memory system 104, which may, in some embodiments, be coupled to processor 102. SOC 100 may also include various additional components, such as transceivers, clock generators, ports, etc.; however, these components have been omitted to promote clarity. In some embodiments, the SOC 100 incorporates all of its components on a single chip substrate. Processor 102 may be a control processor, a signal processor, a central processor or any other type of processor and/or controller. Processor 102 may be, for example, a general-purpose microprocessor, a digital signal processor, a microcontroller, or other suitable device configured to execute instructions for performing operations. Processor architectures generally include execution units (e.g., fixed point, floating point, integer, etc.), instruction decoding, peripherals (e.g., interrupt controllers, timers, direct memory access controllers, etc.), input/output systems (e.g., serial ports, parallel ports, etc.) and various other components and sub-systems.

Memory system 104 includes any type of memory which may provide storage of data and/or instructions that are capable of being processed by processor 102. More specifically, memory system 104 is configured to encode, store, and retrieve data that may be utilized by processor 104. Memory system 104 is coupled to processor 102 such that processor 102 may read from and/or write data and/or instructions to memory system 104 for storage. In some embodiments, memory system 104 is a part of processor 102 while in alternative embodiments, memory system 104 is distinct from processor 102. Furthermore, multiple memory systems 104 may be included in SOC 100.

Figure 2:
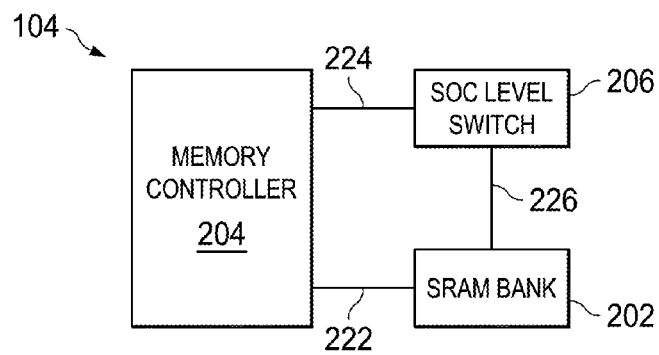
FIG. 2 shows a block diagram of a memory system in accordance with various embodiments.

FIG. 2 shows a block diagram of memory system 104 in accordance with various embodiments. Memory system 104 may include SRAM bank 202, memory controller 204, and SOC level switch 206. In some embodiments, SOC level switch 204 is not present in memory system 104. The SRAM bank 202 may be configured to store data in storage cells of an SRAM array that is located within the SRAM bank 202.

Memory controller 202 is configured to manage flow of data to (i.e., the reading data from and writing data to) storage cells located in SRAM bank 206. Additionally, memory controller 202 is configured to manage the power up (i.e., the increase in voltage from zero or near zero to a predetermined level in an SRAM array located in the SRAM bank 206 so that the data may be read from and/or written to the SRAM array) of the SRAM array in the SRAM bank 206. In order to initiate a power up of the SRAM array in the SRAM bank 206, the memory controller 202 may transmit a power up control signal 222 to the SRAM bank 206 to initiate the power up of the SRAM array. In some embodiments, memory controller 202 may also be configured to manage the power down (i.e., the decrease of voltage in the SRAM array in the SRAM bank 206 to a level at or near zero) of the SRAM array in the SRAM bank 206.

In some embodiments, SOC level switch 206 is configured to cause VNWA to ramp up within the SRAM array in the SRAM bank 206 prior to VDDAR ramping up in the SRAM array. In alternative embodiments, SOC level switch 206 is not present in the memory system 104. SOC level switch 206, in some embodiments, is configured to be powered by an always on power supply. More specifically, in some embodiments, SOC level switch 206 is always powered and during power up of the SRAM array, may route an output signal 226 that causes the ramp up of VNWA prior to the ramp up of VDDAR. SOC level switch 206 additionally may receive an NWA control signal 224 from the memory controller 204 which acts to control power provided by VNWA to the storage array in the SRAM bank 202 after VNWA has ramped up to the predetermined level.

Figure 3:
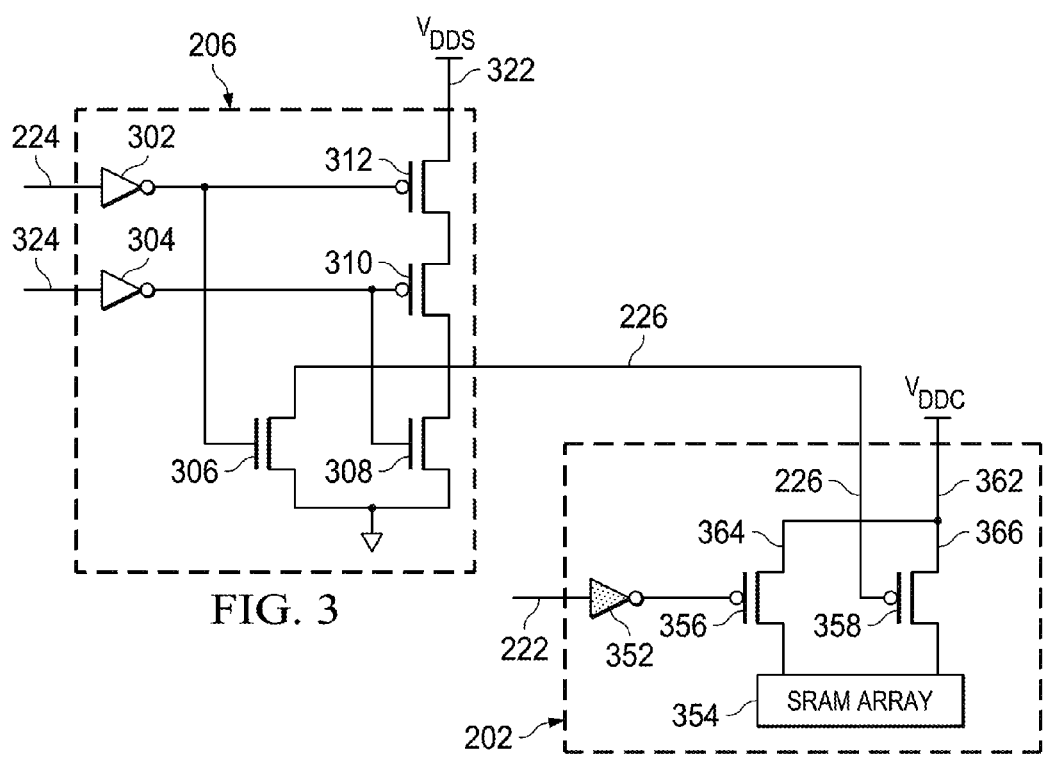
FIG. 3 shows a circuit diagram of a SOC level switch in combination with a static random access memory (SRAM) bank in accordance with various embodiments.

FIG. 3 shows a circuit diagram of SOC level switch 206 in accordance with various embodiments. The SOC level switch 206 may include inverters 302-304 and transistors 306-312 and may be powered by always on power supply (VDDS) 322. As previously discussed, VDDS 322 provides power to SOC level switch 206 at all times including when the SRAM array within the SRAM bank is powered down and is not receiving VNWA or VDDAR. Inverters (i.e., NOT gates) 302-306 are logic gates which implement logical negation. More specifically, inverter 302 may be configured to receive NWA control signal 224 from memory controller 204. If the NWA control signal 224 is HIGH, then inverter 302 outputs a LOW signal. However, if NWA control signal 224 is LOW, then inverter 302 outputs a HIGH signal. Similarly, inverter 304 may be configured to receive a port control signal 324. If the port control signal 324 is HIGH, then inverter 304 outputs a LOW signal. However, if port control signal 324 is LOW, then inverter 304 outputs a HIGH signal. The port control signal 324 indicates that the SRAM array within the SRAM bank 202 is to power up.

Transistors 306-312 act as switches that gate the NWA control signal 224 until VNWA is fully ramped up in the SRAM array of the SRAM bank 202. In some embodiments, transistors 306-312 are metal-oxide-semiconductor field-effect transistors (MOSFETs). While shown as n-channel MOSFETS (NMOS transistors), in some embodiments, transistors 306-308 may be p-channel metal-oxide-semiconductor field-effect (PMOS) transistors, p-type junction gate field-effect transistors (PJFET), n-type junction gate field-effect transistors (NJFET), and/or bipolar junction transistors (BJT) (including PNP and NPN transistors). Furthermore, while shown as PMOS transistors, transistors 310-312 may be NMOS transistors, PJFETs, NJFETs, and/or BJTs.

In some embodiments, transistor 306 receives at its gate the output of inverter 302 while the source of transistor 306 is connected to the source of transistor 308. The signal at the drain of the transistor 306 is the output signal 226. In addition to being connected to the source of transistor 306, transistor 308 is connected to the output of inverter 304 at the gate of transistor 308 while the drain of transistor 308 is connected to the drain of transistor 310. The gate of transistor 310 is connected to the output of inverter 304 while the source of transistor 310 is connected to the drain of transistor 312. The gate of transistor 312 is connected to the output of inverter 302 while the source of transistor 312 is connected to VDDS 322.

Port control signal 324 is configured to be LOW, in some embodiments, immediately prior to and/or at power up and while VNWA ramps up. Due to the arrangement of the transistors 306-312, the output signal 226 is driven LOW as long as port control signal 324 is LOW. Thus, immediately prior to and/or at power up and while VNWA ramps up, the output signal 226 may be driven LOW which causes VNWA to begin to ramp up in the SRAM array of SRAM bank 202. Once VNWA is stable within the SRAM array in SRAM bank 202, port control signal 324 is configured to be HIGH. Due to the arrangement of the transistors 306-312, the output signal 226 is driven by NWA control signal 224. In other words, when the port control signal 324 is LOW, a LOW output signal 226 is routed to the SRAM bank 202; however, when the port control signal 324 is HIGH, the NWA control signal 224 is routed to the SRAM bank 202 to control VNWA in the SRAM array.

SRAM bank 202 may include delay inverter 352, SRAM array 354, and switches 356-358. SRAM array 354 may include a plurality of word lines which correspond to the rows of SRAM array 354 and a plurality of differential pairs of bit lines that correspond to columns of SRAM array 354. At the intersection of each of the word lines and the columns, are the storage cells that make up SRAM array 354.

Each of the storage cells in SRAM array 354 may be arranged to store a single bit of data. In some embodiments, each of the storage cells comprises a six-transistor ("6T") SRAM cell that is formed with a pair of cross-coupled inverters. Each inverter includes a p-channel transistor and an n-channel transistor. The source of a first pass gate transistor is connected to the gate nodes of the first inverter and the drain nodes of the second inverter. Similarly, the source of a second pass gate transistor is connected to the gate nodes of the second inverter and the drain nodes of the first inverter. The gates of the pass gate transistors are connected to a common word line while the drains of the pass gate transistors are connected to a differential pair of bit lines. In alternative embodiments, the storage cells of SRAM array 354 may be any type of SRAM bit cell, such as a four-transistor ("4T") SRAM cell, an eight-transistor ("8T") SRAM cell, a ten-transistor ("10T") SRAM cell, or any other SRAM storage cell.

Switches 356-358, which, in some embodiments are PMOS transistors, are configured to be coupled with VDDC 362 which supplies VDDAR 364 and VNWA 366 to the SRAM array 354. In some embodiments, VDDC 362 is provided by a voltage regulator in SOC 100. In other embodiments, switches 356-358 may be any other type of semiconductor switch, such as NMOS transistors. Switch 358 is configured to be switched open (or turned off) in a power saving mode such that GEDL is eliminated in the SRAM array 354. As previously discussed, during power up, output signal 226 is driven LOW; therefore, switch 358 is closed. Hence, VNWA 366, which is connected to switch 358 ramps up within the SRAM array 354. Once ramp up of VNWA 366 within the SRAM array 354 is complete, the control of switch 358 is passed to the memory controller 204 through NWA control signal 224.

Delay inverter 352 is a logic gate which implements logical negation. More specifically, delay inverter 352 may be configured to receive a power up control signal 222 from memory controller 204. If the power up control signal 222 is HIGH, then inverter 352 outputs a LOW signal. However, if power up control signal 222 is LOW, then inverter 352 outputs a HIGH signal. The power up control signal 222 is a signal transmitted by the memory controller 204 to cause switch 356 to close such that VDDAR 364 powers the SRAM array 354. Because the inverter 352 is a delay inverter, the power up control signal 222 is not received at the gate of switch 356 until after switch 358 closes. In some embodiments, delay inverter 352 is configured to delay receipt of the power up control signal 222 by the gate of switch 356 until after VNWA has fully ramped up. Thus, switch 356 closes after VNWA has ramped up in SRAM array 354.

In other words, switch 358 may be opened (i.e., turned off) when power is removed from the SRAM array 354 by output signal 226. This may eliminate GEDL in SRAM array 354. Furthermore, switch 358 is designed with always on control logic (i.e., SOC level switch 206) as a "timingindependent" circuit to prevent any latch-up during power-up of the SRAM array 354. More particularly, the gate control of switch 358 is held LOW during VDDC 362 ramp-up using the control logic of SOC level switch 206. This ensures that switch 358 is closed (i.e., on) immediately upon receiving the signal to power up SRAM array 354. Therefore, VDDAR begins to ramp up after VNWA is already fully ramped up. Thus, any potential latch-up is prevented. NWA control signal 224, which is received from memory controller 204 is driven a strong LOW as long as port control signal 324 is LOW. Once port control signal 324 is HIGH, indicating the VDDC 362 regulator inside the SOC 100 is providing stable VDDC 362, SOC level switch 206 propagates output signal 226 to switch 358. This signal may control GEDL when the SRAM array 354 is removed from power.

Figure 4:
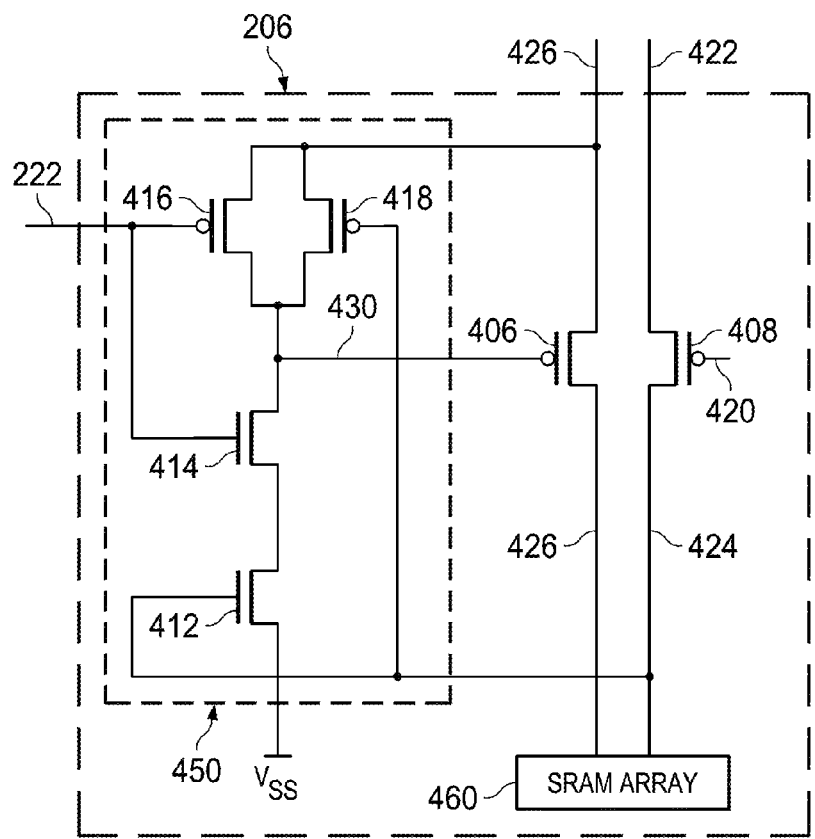
FIG. 4 shows a circuit diagram of a SRAM bank in accordance with various embodiments.

FIG. 4 shows a circuit diagram of SRAM bank 202 in accordance with various embodiments. Instead of utilizing SOC level switch 206 to ensure that VNWA ramps up prior to VDDAR, a NAND gate 450 may be utilized to control switch 406. In this example of SRAM bank 202, switch 406, which, in some embodiments is a PMOS transistor, is configured to be coupled with VDDAR 426 and to the SRAM array 460. Switch 408, which in some embodiments is a PMOS transistor, is configured to be coupled with VNWA 422 and to the SRAM array 460. In other embodiments, switches 406-408 may be any other type of semiconductor switch, such as NMOS transistors.

Switch 408 is configured to receive an NWELL ON signal 420 once a determination is made that power up of the SRAM array 460 is to begin. More particularly, the gate of switch 408 is configured to receive the NWELL ON signal 420 and the source of switch 408 is configured to receive VNWA 422. The NWELL ON signal 420 causes the switch 408 to close thereby producing an internal NWELL supply signal 424 that is equivalent to VNWA 422. In other words, the drain of switch 408 routes the internal NWELL supply signal 424 to a NAND gate 450 and SRAM array 460. The internal NWELL supply signal 424 ramps up and powers the NWELL within the SRAM array 460.

NAND gate 450 is a logical gate which is configured to perform a NAND operation. More specifically, NAND gate 450 may be configured to receive power on control signal 222 from memory controller 204 and internal NWELL supply signal 424. The power on control signal 222 may be produced by the same power supply as the NWELL ON signal 420. Thus, NAND gate 450 may receive the power on control signal 222 at the same time that switch 408 receives the NWELL ON signal 420. If the power on control signal 222 and the internal NWELL supply signal 424 are not both HIGH, then the output of the NAND gate 430 (i.e., the switch 406 control signal 430) is HIGH. For example, if the power on control signal 222 is HIGH and the internal NWELL supply signal 424 is LOW, the power on control signal 222 is LOW and the internal NWELL supply signal is HIGH, or the power on control signal 222 is LOW and the internal NWELL supply signal is LOW, the switch 406 control signal 430 is HIGH. However, if both the power on control signal 222 is HIGH and the internal NWELL supply signal is HIGH, then the switch 406 control signal 430 is LOW. Thus, only when the internal NWELL supply signal 424 and the power up control signal 222 are both HIGH will the switch 406 control signal 430 be LOW. Therefore, only when the internal NWELL supply signal 424 and the power up control signal 222 are both HIGH will the switch 406 close. Hence, VDDAR 426 only begins to ramp up after the internal NWELL supply signal 424 has fully ramped up. In other words, VDDAR 426 is gated by the internal NWELL supply signal 424.

NAND gate 450 may, in some embodiments, include the transistors 412-418. Transistors 412-414 may be NMOS transistors while transistors 416-418 may be PMOS transistors. In some embodiments, the gate of transistor 412 receives the internal NWELL supply signal 424 while the source of transistor 412 is connected to a supply voltage VSS. The drain of transistor 412 is connected to the source of transistor 414. The gate of transistor 414 is connected to the power on control signal 222 while the drain is of transistor 414 is connected to the switch 406 control signal 430. Transistor 416 receives the power on control signal 222 at its gate and VDDAR 426 at its source. Transistor 418 receives the internal NWELL supply signal 424 at its gate and VDDAR 426 at its source. The drains of both transistors 416 and 418 are connected to the power on control signal 222. In this way, the transistors 412-418 may create NAND gate 450 which ensures that internal NWELL supply signal 424 ramps up prior to VDDAR ramping up in order to prevent latch-up without the SOC level switch 206.

Figure 5:
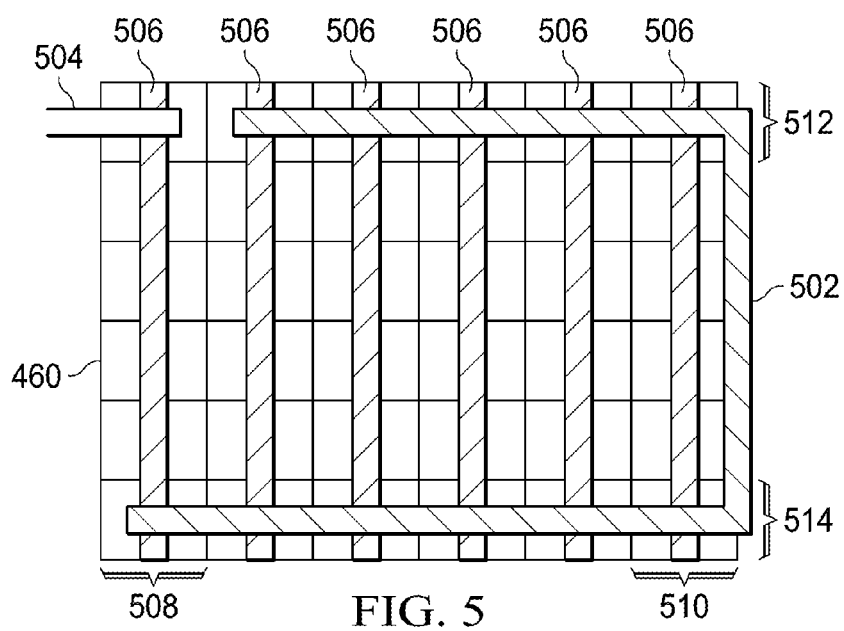
FIG. 5 shows a block diagram of an SRAM array in accordance with various embodiments.

FIG. 5 shows a block diagram of an SRAM array 460 in accordance with various diagrams. The SRAM array 460 may include a plurality of NWELLs 506 that are connected to the cells of the array. The SRAM array 460 may include edge cells that are found in rows 512-514 and columns 508-510. All the remaining cells of the SRAM array 460 may be storage cells of the array that store a single bit of data each. The NWELL has a much higher resistance and capacitance compared to VDDAR due to the materials of the SRAM array 460. Therefore, VNWA ramp up time through the NWELLs 506 is much higher than VDDAR ramp up time in the storage cells of the SRAM array 460. Therefore, it is desirable to implement an SRAM array 460 that produces an internal NWELL output signal 504 to directly gate the VDDAR power up which may be utilized instead of internal NWELL supply signal 424 as an input to NAND gate 450.

Internal NWELL signal route 502 is the route of the internal NWELL signal 424 in the SRAM array 460. The internal NWELL signal route 502 allows the internal NWELL signal 424 to flow through all of the cells of the SRAM array 460. However, the internal NWELL output signal 504 is separated from the internal NWELL signal route 502. In other words, there is a break in the route of the internal NWELL signal 424 as it flows though the SRAM array 460. Thus, the internal NWELL output signal 504 is delayed based on the resistance/capacitance of the SRAM array 460 and may be utilized in FIG. 4 as the input, along with the power on control signal 222 for the NAND gate 450. This ensures that the switch 406 cannot close until the NWELLs 506 within the SRAM array 460 are fully ramped up. Therefore, VDDAR will not ramp up until after VNWA and any potential latch-up is prevented.

FIG. 6 shows a flow diagram of a method 600 for preventing latch-up in a SOC in accordance with various embodiments. FIG. 7 shows a flow diagram of a method 700 for closing two switches in accordance with various embodiments. FIG. 8 shows a flow diagram of a method 800 for closing two switches in accordance with various embodiments. Though depicted sequentially as a matter of convenience, at least some of the actions shown in methods 600, 700, and 800 can be performed in a different order and/or performed in parallel. Additionally, some embodiments may perform only some of the actions shown or may perform additional actions. In some embodiments, at least some of the operations of the methods 600, 700, and 800, as well as other operations described herein, can be performed by memory controller 204, SOC level switch 206, and/or SRAM bank 202 implemented by a processor executing instructions stored in a non-transitory computer readable storage medium or a state machine.

The method 600 begins in block 602 with receiving a SRAM array power signal, such as VDDAR signal 364 and/or 426, to power a plurality of storage cells of an SRAM array, such as SRAM array 354 and/or 460. The SRAM array power signal may be received by a first switch, such as switch 356 and/or switch 406. In block 604, the method 600 continues with receiving an NWELL power signal, such as VNWA 366 and/or 422, to power a plurality of NWELLs, such as NWELLs 506, of the SRAM array. The NWELL power signal may be received by a second switch, such as switch 358 and/or 408.

The method 600 continues in block 606 with closing the second switch to route the NWELL power signal to a bulk of a transistor of one of the storage cells of the SRAM storage array. In block 608, the method 600 continues with closing the first switch to route the SRAM array power signal to a source of the transistor of one of the storage cells of the SRAM array. The closing of the first switch may occur after closing the second switch. This prevents the possibility of latch-ups.

FIG. 7 shows a flow diagram of method 700 for closing two switches in accordance with various embodiments. The method 700 begins in block 702 with receiving a port control signal, such as port control signal 324. The port control signal may indicate that an SRAM array, such as SRAM array 354 is to power up. The port control signal may be received by a SOC level switch, such as SOC level switch 206. In block 704, the method 700 continues with routing, based on receiving the port control signal indicating that the SRAM is to power up, an output signal, such as output signal 226, from the SOC level switch to the gate of the second switch, such as switch 358, causing the second switch to close. The SOC level switch may be powered by an always on power supply. The method 700 continues in block 706 with receiving a power up control signal, such as power up control signal 222 after the second switch closes. The power up control signal causes the first switch, such as switch 356, to close. The power up control signal may be received by the gate of the first switch.

FIG. 8 shows a flow diagram of method 800 for closing two switches in accordance with various embodiments. The method 800 begins in block 802 with receiving a power up control signal, such as power up control signal 222, and a NWELL output signal, such as internal NWELL output signal 504. The NWELL output signal comprises an internal NWELL supply signal, such as internal NWELL supply signal 424, routed to the SRAM array, such as SRAM array 460, after the second switch, such as switch 408, closes and after providing power to a plurality of NWELLs, such as NWELLs 506, of the SRAM array. The power up control signal and NWELL output signal may be received by a NAND gate, such as NAND gate 450. In block 804, the method 800 continues with generating a first switch control signal, such as switch 406 control signal 430, based on the NWELL output signal and the power up control signal being HIGH. The generating a first switch control signal may be performed by the NAND gate. The closing the first switch is based on the first switch control signal indicating the NWELL output signal and the power up control signal are HIGH.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system on a chip (SOC), comprising:
a processor; and
a memory system coupled to the processor, the memory system including a static random access memory (SRAM) bank and a memory controller, the SRAM bank including a first switch coupled to a SRAM array power supply and a source of a transistor of an SRAM storage cell in an SRAM array and a second switch coupled to a NWELL power supply and a bulk of the transistor of the SRAM storage cell;
wherein the second switch is configured to close prior to the first switch closing during power up of the SRAM array.

2. The SOC of claim 1, wherein the memory system further comprises a SOC level switch coupled to the second switch, the SOC level switch configured to:
receive a port control signal that indicates that the SRAM array is to power up; and
based on receiving the port control signal indicating that the SRAM array is to power up, route an output signal to a gate of the second switch causing the second switch to close.

3. The SOC of claim 2, wherein, the SOC level switch, based on receiving port control signal that indicates that the SRAM array power supply has fully ramped up, route NWA control signal from the memory controller to the second switch.

4. The SOC of claim 3, wherein the SOC level switch is powered by an always on power supply.

5. The SOC of claim 4, wherein the first switch is configured to:
receive a power up control signal delayed by an inverter to arrive at a gate of the first switch after the second switch closes; and
based on receiving the power up control signal, close to route the SRAM array power supply signal to the source of the transistor of the SRAM storage cell.

6. The SOC of claim 1, wherein the SRAM bank further includes a NAND gate coupled to the first and second switches, the NAND gate configured to receive a power up control signal and an internal NWELL supply signal and to output a first switch control signal.

7. The SOC of claim 6, wherein the first switch control signal causes the first switch to close based on the internal NWELL supply signal and the power up control signal being HIGH.

8. The SOC of claim 6, wherein a gate of the second switch is configured to receive an NWELL ON signal to close the second switch, a source of the second switch is configured to receive an NWELL power supply signal, and a drain of the second switch is configured to route the internal NWELL supply signal.

9. The SOC of claim 8, wherein the power gating signal and the NWELL ON signal are generated by one power supply.

10. A method for preventing latch-up in a system on a chip (SOC) comprising:

receiving, by a first switch, a static random access memory (SRAM) array power signal configured to power a plurality of storage cells of an SRAM array;
receiving, by a second switch, a NWELL power signal configured to power a plurality of NWELLs of the SRAM array;
closing the second switch to route the NWELL power signal to a bulk of a transistor of one of the storage cells; and
after closing the second switch, closing the first switch to route the SRAM array power signal to a source of the transistor.

11. The method of claim 10, further comprising:
receiving, by a SOC level switch, a port control signal from a memory controller, the port control signal indicating that the SRAM array is to power up; and
based on receiving the port control signal indicating that the SRAM is to power up, routing an output signal from the SOC level switch to a gate of the second switch causing the second switch to close; and
receiving, by a gate of the first switch, a power up control signal after the second switch closes causing the first switch to close;
wherein the SOC level switch is powered by an always on power supply.

12. The method of claim 10, further comprising:
receiving, by a NAND gate, a power up control signal and a NWELL output signal, the NWELL output signal comprising an internal NWELL supply signal routed to the SRAM array after the second switch closes and after providing power to a plurality of NWELLs of the SRAM array; and
generating, by the NAND gate, a first switch control signal based on the NWELL output signal and the power up control signal being HIGH;
wherein the closing the first switch is based on the first switch control signal indicating the NWELL output signal and the power up control signal are HIGH.

13. A static random access memory (SRAM) bank, comprising:
an SRAM array that includes a plurality of storage cells and a plurality of edge cells surrounding the plurality of storage cells;
a first switch coupled to a SRAM array power supply and a source of a given transistor in each of the plurality of storage cells; and
a second switch coupled to a NWELL power supply and a bulk of the given transistor in each of the plurality of storage cells;
wherein the second switch is configured to close prior to the first switch closing during power up of the SRAM array.

14. The SRAM bank of claim 13, wherein the second switch is configured to, based on receiving an output signal at a gate of the second switch indicating that the SRAM array is to power up from a system on chip (SOC) level switch that is powered by an always on power supply, close.

15. The SRAM bank of claim 14, wherein the second switch is further configured to receive a NWA control signal from the SOC level switch based on the SOC level switch receiving a port control signal indicating that the SRAM array power supply has fully ramped up.

16. The SRAM bank of claim 14, wherein the first switch is configured to receive a power up control signal delayed by a delay inverter to arrive at a gate of the first switch after the second switch closes, the power up control signal configured to cause the first switch to close.

17. The SRAM bank of claim 13, further comprising a NAND gate coupled to the first and second switches, the NAND gate configured to receive a power up control signal and a NWELL output signal comprising an internal NWELL supply signal routed to the SRAM array after the second switch closes and after providing power to a plurality of NWELLs of the SRAM array and to output a first switch control signal based on both the power up control signal and the NWELL output signal being HIGH.

18. The SRAM bank of claim 17, wherein a gate of the second switch is configured to receive an NWELL ON signal causing the second switch to close and route an internal NWELL supply signal to the plurality of NWELLs of the SRAM array.

19. The SRAM bank of claim 18, wherein the power gating signal and the NWELL ON signal are generated by one power supply.

20. The SRAM bank of claim 13, wherein the first and second switches are p-channel metal-oxide-semiconductor field-effect (PMOS) transistors.

* * * * *